United States Patent [19]

Kim

[11] Patent Number: 5,530,387
[45] Date of Patent: Jun. 25, 1996

[54] FREQUENCY MULTIPLIER CIRCUIT

[75] Inventor: Tae K. Kim, Kyungki-Do, Rep. of Korea

[73] Assignee: Goldstar Electron Co., Ltd., Choongchungbook-Do, Rep. of Korea

[21] Appl. No.: 367,616

[22] Filed: Jan. 3, 1995

[30] Foreign Application Priority Data

Apr. 14, 1994 [KR] Rep. of Korea .................. 7861/1994

[51] Int. Cl.⁶ .................................. H03B 19/00
[52] U.S. Cl. .......................... 327/119; 327/116; 327/284; 377/47
[58] Field of Search ...................... 327/116, 119, 327/122, 271, 277, 284, 152, 113; 377/47

[56] References Cited

U.S. PATENT DOCUMENTS

| | | | |
|---|---|---|---|
| 4,596,954 | 6/1986 | Haque | 327/116 |
| 4,707,665 | 11/1987 | Nugent et al. | 327/119 |
| 4,799,022 | 1/1989 | Skierszkan | 327/116 |
| 5,077,686 | 12/1991 | Rubinstein | 377/47 |
| 5,111,066 | 5/1992 | Artieri et al. | 327/116 |
| 5,321,734 | 6/1994 | Ogata | 377/47 |
| 5,365,181 | 11/1994 | Mair | 377/47 |

Primary Examiner—Timothy P. Callahan
Assistant Examiner—My-Trang Nu Ton
Attorney, Agent, or Firm—Lowe, Price, LeBlanc & Becker

[57] ABSTRACT

A frequency multiplier circuit comprising a first delay circuit for delaying sequentially a reference clock signal, a frequency doubler for delaying the reference clock signal and combining logically the delayed reference clock signal and the reference clock signal, a second delay circuit for delaying sequentially an output signal from the frequency doubler, a signal detector for logically combining the output signal from the frequency doubler and a plurality of output signals from the second delay circuit to detect a desired duty factor of signal, a decoder for decoding a plurality of output signals from the first delay circuit and a plurality of output signals from the signal detector to output a signal delayed by n times half a period of the reference clock signal, and a frequency generator for logically combining an output signal from the decoder and the reference clock signal to generate a multiple frequency of that of the reference clock signal. According to the present invention, the frequency multiplier circuit can automatically adjust an operating point regardless of a variation in a temperature or a process parameter.

9 Claims, 3 Drawing Sheets

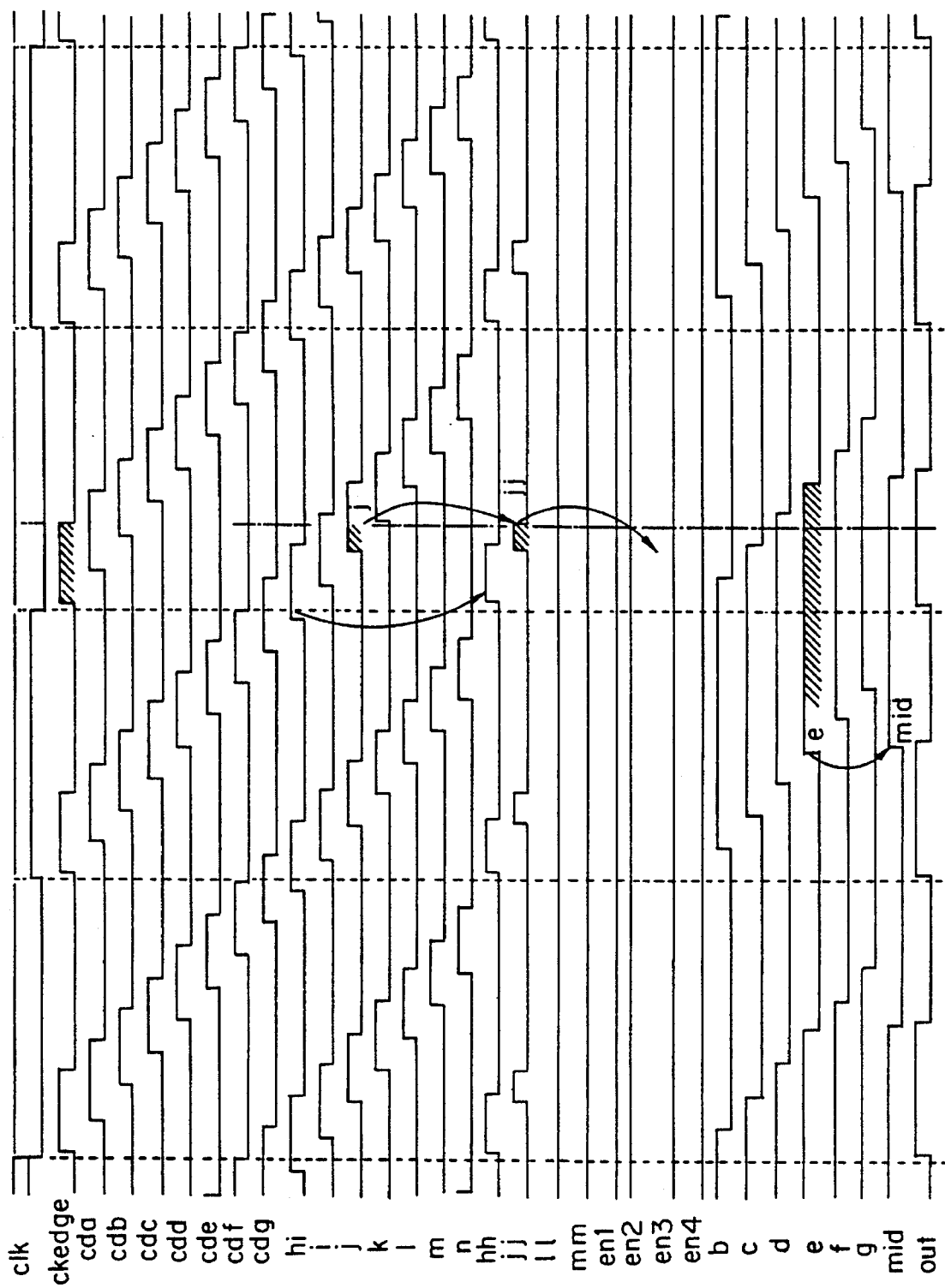

FREQUENCY MULTIPLIER CIRCUIT

BACKGROUND OF THE INVENTION

1. Field of the Invention

The present invention relates in general to frequency multiplier circuits, and a frequency multiplier circuit in which a clock signal of a frequency of double that of an input clock signal is generated at a point of time that the input clock signal is synchronous with a signal obtained by delaying the input clock signal by half a period of the input clock signal, the generated double frequency clock signal is transited at a point of half a period of the input clock signal, and clock signals of frequencies of n times that of the input clock signal may be generated and transited at positions of 1/n times a period of the input clock signal to adjust a duty factor, where n is 2, 3, 4, . . . .

2. Description of the Prior Art

In designing a system, a delay circuit or a phase locked loop (PLL) circuit may generally be used to obtain a signal providing a position of ¼ a period of a clock signal for the system.

Referring to FIG. 1, there is shown a block diagram of a conventional frequency multiplier circuit. As shown in this drawing, the conventional frequency multiplier circuit comprises a frequency divider 1 for dividing a frequency of a reference clock signal ref by n, a phase detector 2 for comparing a frequency of an output signal from the frequency divider 1 with a frequency of n*m times that of the reference clock signal ref and generating a pulse train in accordance with the compared result, a low pass filter 3 for removing a high-frequency component from an output signal from the phase detector 2, a voltage controlled oscillator 4 for generating an oscillating frequency in response to an output voltage from the low pass filter 3, and a frequency divider 5 for dividing an output frequency from the voltage controlled oscillator 4 by m and outputting the resultant clock signal to the phase detector 2, the clock signal having the frequency of n*m times that of the reference clock signal ref, where n and m are a degree and a multiple in dividing the reference clock signal ref, respectively.

The operation of the conventional frequency multiplier circuit with the above-mentioned construction will hereinafter be described.

At an initial state, the voltage controlled oscillator 4 outputs an initial frequency signal to the frequency divider 5. Then, the frequency divider 5 outputs a signal of a frequency of m times that of the initial frequency signal from the voltage controlled oscillator 4 to the phase detector 2.

At this time, the frequency divider 1 divides the frequency of the reference clock signal ref by n and outputs a signal of a frequency of n times that of the reference clock signal ref to the phase detector 2. The phase detector 2 compares the frequency of the output signal from the frequency divider 1 with the frequency of the output signal from the frequency divider 5. As a result of the comparison, if the frequency of the output signal from the frequency divider 1 is higher than that of the output signal from the frequency divider 5, the phase detector 2 outputs a positive pulse train. On the contrary, if the frequency of the output signal from the frequency divider 1 is lower than that of the output signal from the frequency divider 5, the phase detector 2 outputs a negative pulse train.

The low pass filter 3 filters the output signal from the phase detector 2 to pass a low-frequency component therefrom. Then, the low pass filter 3 adjusts the passed low-frequency component to adjust a level of its output voltage. Namely, upon receiving the positive pulse train from the phase detector 2, the low pass filter 3 increases the level of its output voltage. On the contrary, receiving the negative pulse train from the phase detector 2, the low pass filter 3 reduces the level of its output voltage.

As the low pass filter 3 increases or reduces the level of its output voltage, the voltage controlled oscillator 4 increases or reduces the oscillating frequency. The resultant oscillating frequency from the voltage controlled oscillator 4 is applied to the frequency divider 5.

With the above operation repeatedly performed, the output signals from the frequency dividers 1 and 5 become the same in phase at a certain time point. In this case, the output of the phase detector 2 becomes "0" and the oscillating operation of the voltage controlled oscillator 4 becomes stable as the output signal therefrom is circulated through the frequency divider 5. As a result, the frequency of the output signal from the voltage controlled oscillator 4 is m time that of the reference clock signal ref.

However, the above-mentioned conventional frequency multiplier circuit has a disadvantage in that it may have a faulty operation under the great influence of a temperature variation or a process parameter in the case of employing a delay circuit. Also, in the case of employing a PLL, the conventional frequency multiplier circuit is desirable to perform an accurate operation, but has the disadvantage that resistors and capacitors must additionally be provided in the outside of the PLL chip, resulting in the increase in the size of the entire circuit and the manufacturing cost.

In other words, the conventional frequency multiplier circuit requires essentially the resistors and the capacitors because it is an analog circuit. This requirement of the conventional frequency multiplier circuit results in the increase in the size and cost of a semiconductor chip to be manufactured. Also, much time is required from the initial step till the stabilization in the frequency of the output signal. Further, a tuning work is difficult to perform in designing the semiconductor chip. Moreover, the temperature variation or the process parameter of the manufactured semiconductor chip has the great effect on the conventional frequency multiplier circuit, resulting in the faulty operation.

SUMMARY OF THE INVENTION

Therefore, the present invention has been made in view of the above problems, and it is an object of the present invention to provide a frequency multiplier circuit which is capable of automatically adjusting an operating point regardless of a temperature variation or a process parameter because it comprises digital gates.

In accordance with the present invention, the above and other objects can be accomplished by a provision of a frequency multiplier circuit comprising first delay means for delaying sequentially a reference clock signal; frequency doubling means for delaying said reference clock signal and combining logically the delayed reference clock signal and said reference clock signal; second delay means for delaying sequentially an output signal from said frequency doubling means; signal detection means for logically combining the output signal from said frequency doubling means and a plurality of output signals from said second delay means to detect a desired duty factor of signal; decoding means for decoding a plurality of output signals from said first delay means and a plurality of output signals from said signal detection means to output a signal delayed by n times half a period of said reference clock signal; and frequency generation means for logically combining an output signal from said decoding means and said reference clock signal to generate a multiple frequency of that of said reference clock signal.

BRIEF DESCRIPTION OF THE DRAWINGS

The above and other objects, features and advantages of the present invention will be more clearly understood from the following detailed description taken in conjunction with the accompanying drawings, in which:

FIGS. 3A to 3AF are waveform diagrams of signals from components in FIG. 2.

DETAILED DESCRIPTION OF THE PREFERRED EMBODIMENTS

Figure 1:
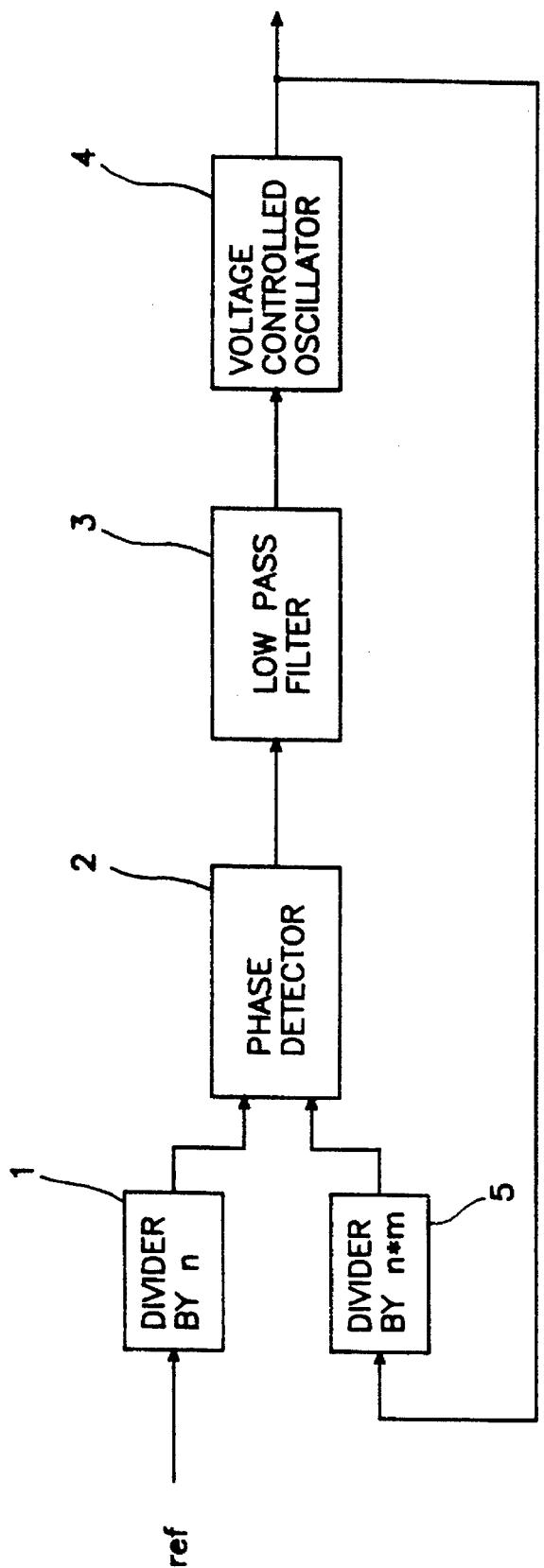
FIG. 1 is a block diagram of a conventional frequency multiplier circuit.
Figure 2:
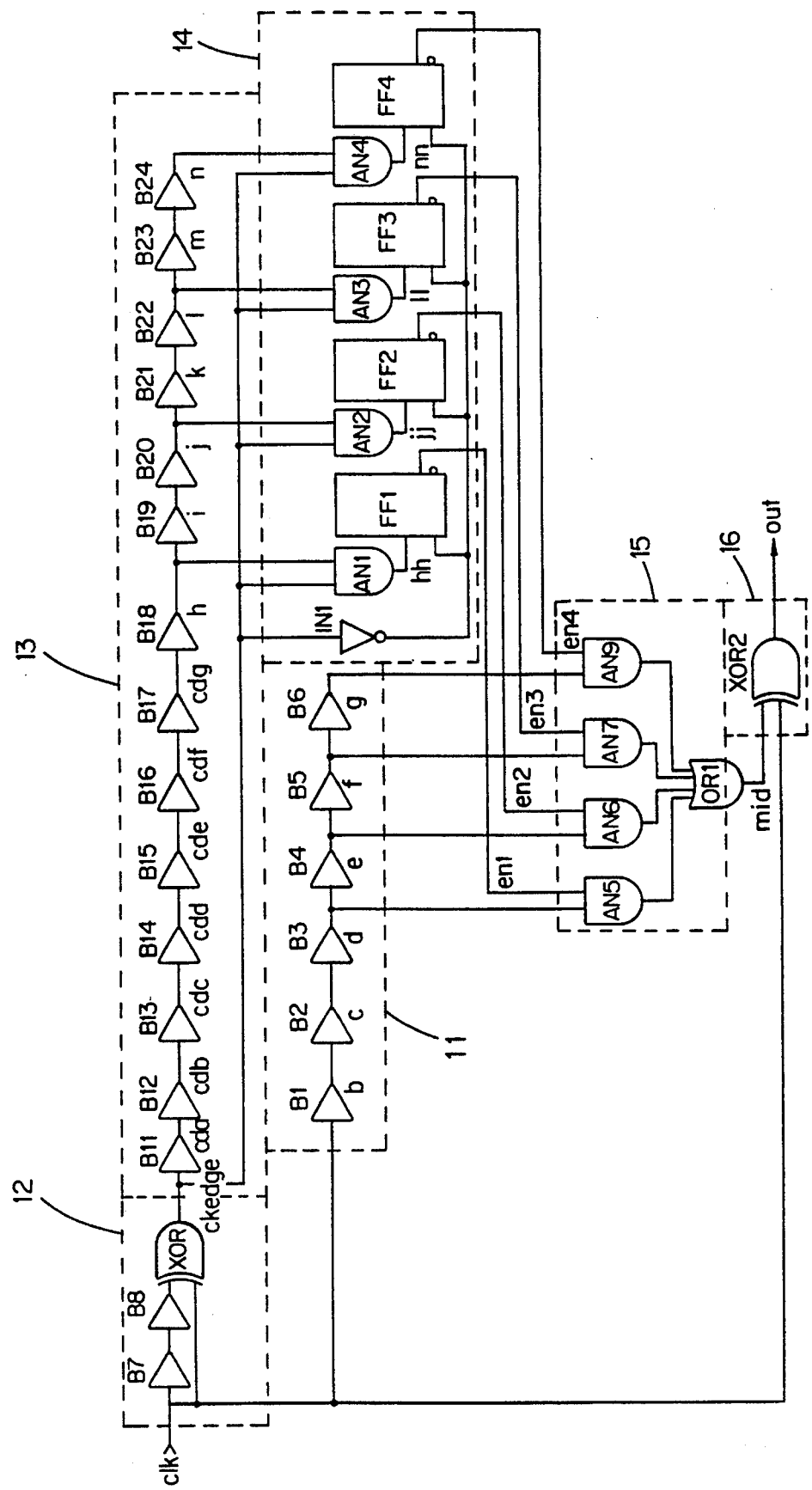
FIG. 2 is a circuit diagram of a frequency multiplier circuit in accordance with the present invention.

Referring to FIG. 2, there is shown a circuit diagram of a frequency multiplier circuit in accordance with the present invention. As shown in this drawing, the frequency multiplier circuit comprises a first delay circuit 11 for delaying sequentially a reference clock signal clk. To this end, the first delay circuit 11 includes six buffers B1–B6 for delaying sequentially the reference clock signal clk. A frequency doubler 12 is adapted to delay sequentially the referency clock signal clk and combine logically the sequentially delayed reference clock signal and the reference clock signal clk. To this end, the frequency doubler 12 includes two buffers B7 and B8 for delaying sequentially the reference clock signal clk and an exclusive OR gate XOR1 for exclusive-ORing an output signal from the buffer B8 and the reference clock signal clk. A second delay circuit 13 is adapted to delay sequentially an output signal from the frequency doubler 12. To this end, the second delay circuit 13 includes fourteen buffers B11–B24 for delaying sequentially the output signal from the frequency doubler 12.

The frequency multiplier circuit also comprises a signal detector 14 for logically combining the output signal from the frequency doubler 12 and output signals from the buffers B18, B20, B22 and B24 in the second delay circuit 13 to detect a desired duty factor of signal. To this end, the signal detector 14 includes four AND gates AN1–AN4, an inverter IN1 and four flip-flops FF1–FF4. The AND gate AN1 ANDs the output signal from the frequency doubler 12 and the output signal from the buffer B18 and outputs the resultant signal to the flip-flop FF1. The AND gate AN2 ANDS the output signal from the frequency doubler 12 and the output signal from the buffer B20 and outputs the resultant signal to the flip-flop FF2. The AND gate AN3 ANDs the output signal from the frequency doubler 12 and the output signal from the buffer B22 and outputs the resultant signal to the flip-flop FF3. The AND gate AN4 ANDs the output signal from the frequency doubler 12 and the output signal from the buffer B24 and outputs the resultant signal to the flip-flop FF4. The inverter IN1 inverts the output signal from the frequency doubler 12 and outputs the inverted signal to the flip-flops FF1–FF4. The flip-flops FF1–FF4 latch output Signals from the AND gates AN1–AN4 in response to an output signal from the inverter IN1, respectively.

Further, the frequency multiplier circuit comprises a decoder 15 for decoding output signals from the buffers B3–B6 in the first delay circuit 11 and output signals from the flip-flops FF1–FF4 in the signal detector 14 to output a signal delayed by n times half a period of the reference clock signal clk. To this end, the decoder includes four AND gates AN5–AN8 and an OR gate OR1. The AND gate AN5 ANDs the output signal from the buffer B3 and the output signal from the flip-flop FF1 and outputs the resultant signal to the OR gate OR1. The AND gate AN6 ANDs the output signal from the buffer B4 and the output signal from the flip-flop FF2 and outputs the resultant signal to the OR gate OR1. The AND gate AN7 ANDs the output signal from the buffer B5 and the output signal from the flip-flop FF3 and outputs the resultant signal to the OR gate OR1. The AND gate AN8 ANDs the output signal from the buffer B6 and the output signal from the flip-flop FF4 and outputs the resultant signal to the OR gate OR1. The OR gate OR1 ORes output signals from the AND gates AN5–AN8.

Further, the frequency multiplier circuit comprises a frequency generator 16 for logically combining an output signal from the decoder 15 and the reference clock signal clk to generate a multiple frequency of that of the reference clock signal clk. To this end, the frequency generator 16 includes an exclusive OR gate XOR2 for exclusive-ORing the output signal from the decoder 15 and the reference clock signal clk.

The operation of the frequency multiplier circuit with the above-mentioned construction in accordance with the present invention will hereinafter be described in detail with reference to FIGS. 3A to 3AF, which are waveform diagrams of the signals from the components in FIG. 2.

First, in the frequency doubler 12, the reference clock signal clk as shown in FIG. 3A is sequentially delayed by the buffers B7 and B8 and then applied to the exclusive OR gate XOR1 which also inputs directly the reference clock signal clk. The exclusive OR gate XOR1 exclusive-ORes the output signal from the buffer B8 and the reference clock signal clk and the resultant pulse signal as shown in FIG. 3B. The pulse signal from the exclusive OR gate XOR1 has a high logic duration whenever the reference clock signal clk is transited in logic, as shown in FIG. 3B, the high logic duration corresponding to a delayed time.

The reference clock signal clk as shown in FIG. 3A is also applied to the first delay circuit 11. In the first delay circuit 11, the reference clock signal clk is sequentially delayed by the buffers B1–B6 and then outputted as signals b–g as shown in FIGS. 3Y to 3AD.

In the second delay circuit 13, the output signal from the frequency doubler 12 is sequentially delayed by the buffers B11–B17 and then outputted as signals cda–cdg as shown in FIGS. 3C to 3I. The output signal from the buffer B17 is delayed by the buffer B18 and then outputted as a signal h as shown in FIG. 3J. The output signal from the buffer B17 is delayed by the buffer B18 and then outputted as a signal h as shown in FIG. 3J. The output signal from the buffer B18 is delayed by the buffer B19 and then outputted as a signal i as shown in FIG. 3K. The output signal from the buffer B19 is delayed by the buffer B20 and then outputted as a signal j as shown in FIG. 3L. The output signal from the buffer B20 is delayed by the buffer B21 and then outputted as a signal k as shown in FIG. 3M. The output signal from the buffer B21 is delayed by the buffer B22 and then outputted as a signal l has shown in FIG. 3N. The output signal from the buffer B22 is delayed by the buffer B23 and then outputted as a signal m as shown in FIG. 3O. Finally, the output signal from the buffer B23 is delayed by the buffer B24 and then outputted as a signal n as shown in FIG. 3P.

Then, in the signal detector 14, the AND gates AN1–AN4 compare the output signals from the buffers B18–B24 with the output signal from the frequency doubler 12, respectively. As a result of the comparison, the AND gates AN1–AN4 detect signals in which the output signal from the frequency doubler 12 is overlapped with a signal delayed by half a period of the reference clock signal clk. As a result, the AND gates AN1–AN4 provide signals hh, jj, ll and mm as shown in FIGS. 3Q to 3T, respectively.

The output signal from the frequency doubler 12 is also inverted by the inverter IN1 and then applied to clock terminals of the flip-flops FF1–FF4. The flip-flops FF1–FF4 latch the output signals hh, jj, ll and mm from the AND gates AN1–AN4 at a rising edge of the output signal from the inverter IN1, respectively. As a result, the flip-flops FF1–FF4 provide signals en1–en4 as shown in FIGS. 3U to 3X, respectively. The output signals en1–en4 from the flip-flops FF1–FF4 are applied to one input terminals of the AND gates AN5–AN8 in the decoder 15, respectively.

On the other hand, in the first delay circuit 11, the reference clock signal clk is sequentially delayed by the buffers B1 and B2 and then applied to the buffer B3, which then outputs the delayed signal d as shown in FIG. 3AA. The output signal d from the buffer B3 is delayed by the buffer B4 and then outputted as the signal e as shown in FIG. 3AB. The output signal e from the buffer B4 is delayed by the buffer B5 and then outputted as the signal f as shown in FIG. 3AC. The output signal f from the buffer B5 is delayed by the buffer B6 and then outputted as the signal g as shown in FIG. 3AD. The output signals d–g from the buffers B3–B6 are applied to the other input terminals of the AND gates AN5–AN8 in the decoder 15, respectively.

Then, in the decoder 15, the AND gates AN5–AN8 input the output signals en1–en4 from the signal detector 14 at their one input terminals and the output signals d–g from the first delay circuit 11 at their other input terminals and AND the inputted signals, respectively. The OR gate OR1 ORes the output signals from the AND gates AN5–AN8 and outputs a signal mid delayed by ¼ a period of the reference clock signal clk as shown in FIG. 3AE to the frequency generator 16.

For example, in the case where the output signal from the buffer B20 in the second delay circuit 13 is an overlapped signal, the output signal from the AND gate AN2 in the signal detector 14 remains at its high state for an overlapped time of the output signal from the buffer B20. At this time, the output signal from the AND gate AN2 is held by the flip-flop FF2 triggered at a falling edge of the output signal from the frequency doubler 12. As a result, the output signal from the flip-flop FF2 is applied as an enable signal to the AND gate AN6 in the decoder 15. In this case, the output signal from the flip-flop FF2 maintains its high state at a clock corresponding to ½ a period of a signal delayed until the output signal from the buffer B20 goes high in logic. As being enabled, the AND gate AN6 in the decoder 15 transfers the output signal from the buffer B4 in the first delay circuit 11 to the OR gate OR1. In result, the OR gate OR1 outputs the signal mid delayed by ¼ a period of the reference clock signal clk as shown in FIG. 3AE to the frequency generator 16.

In the frequency generator 16, the exclusive OR gate XOR2 exclusive-ORes the output signal mid from the decoder 15 and the reference clock signal clk and then outputs a signal out of a frequency of double that of the reference clock signal clk as shown in FIG. 3AF.

By the way, in the case where a temperature or a process parameter is varied, there may be a variation in the generation time of the reference clock signal clk, the output signal from the last delay buffer and the signals between the reference clock signal clk and the output signal from the last delay buffer. To cope with such a variation, the AND gates AN1–AN4 in the signal detector 14 compare the output signals from the buffers B18–B24 in the second delay circuit 13 with the output signal from the frequency doubler 12 and output the signals hh, jj, ll and mm in accordance with the compared result, respectively. Then, the signal detector 14 detects one of the output signals hh, jj, ll and mm from the AND gates AND–AN4 in which the output signal from the frequency doubler 12 is overlapped with the signal delayed by half a period of the reference clock signal clk. Namely, a high logic signal of the output signals hh, jj, ll and mm from the AND gates AN1–AN4 is applied as the enable signal to the decoder 15.

Then in the decoder 15, any one of the AND gates AN5–AN8 is enabled in response to the high logic signal from the signal detector 14 to transfer a corresponding one of the output signals from the buffers B3–B6 in the first delay circuit 11. Noticeably, each of the buffers B3–B6 in the first delay circuit 11 forms a node with a delay time corresponding to ½ the time required from the generation of the reference clock signal clk to any one of output nodes of the second delay circuit 13. Therefore, the decoder 15 outputs the signal delayed by ¼ a period of the reference clock signal clk to the frequency generator 16.

Upon receiving the output signal from the decoder 15, the exclusive OR gate XOR2 in the frequency generator 16 exclusive-ORes the received signal and the reference clock signal clk. In result, the output signal from the frequency generator 16 has a frequency of double that of the reference clock signal clk and a duty factor of ¼ that of the reference clock signal clk regardless of the variation in the temperature and the process parameter.

In the other words, the duty factor of the multiple frequency can be adjusted by selecting one of the delayed clock signals corresponding to positions of ½, ⅓, ¼, . . . the time required until the generation of one feedback signal.

As apparent from the above description, according to the present invention, the frequency multiplier circuit can automatically adjust the operating point regardless of the variation in the temperature and the process parameter because it comprises the digital gates. Therefore, the frequency multiplier circuit can obtain the multiple frequency of the desired duty factor. Also, the use of the digital gates has the effect of designing the circuit readily.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A frequency multiplier circuit comprising:
 first delay means for delaying sequentially a reference clock signal;
 frequency doubling means including delay means for delaying said reference clock signal and combining logically the delayed reference clock signal and said reference clock signal;
 second delay means for delaying sequentially an output signal from said frequency doubling means;
 signal detection means for logically combining the output signal from said frequency doubling means and a plurality of output signals from said second delay means to detect a desired duty factor of signal;

decoding means for decoding a plurality of output signals from said first delay means and a plurality of output signals from said signal detection means to output a signal delayed by n times half a period of said reference clock signal; and frequency generation means for logically combining an output signal from said decoding means and said reference clock signal to generate a multiple frequency of that of said reference clock signal.

2. A frequency multiplier circuit as set forth in claim 1, wherein said first delay means includes n/2 delay elements for delaying sequentially said reference clock signal, where n is 2, 3, 4, . . . .

3. A frequency multiplier circuit as set forth in claim 2, wherein ones of said delay elements corresponding to positions of $[\{n/2+(2m)\}\div 2]\pm x$ provide their output signals for said decoding means, where m and x are 1, 2, 3, . . . , respectively.

4. A frequency multiplier circuit as set forth in claim 1, wherein said frequency doubling means includes:

a delay element for delaying said reference clock signal; and an exclusive OR gate for exclusive-ORing an output signal from said delay element and said reference clock signal.

5. A frequency multiplier circuit as set forth in claim 1, wherein said second delay means includes n delay elements for delaying sequentially the output signal from said frequency doubling means.

6. A frequency multiplier circuit as set forth in claim 5, wherein ones of said delay elements corresponding to positions of n/2+2m provide their output signals for said signal detection means, where m is 1, 2, 3, . . . . , .

7. A frequency multiplier circuit as set forth in claim 1, wherein said signal detection means includes:

an inverter for inverting the output signal from said frequency doubling means;

a plurality of AND gates for ANDing m output signals from said second delay means and the output signal from said frequency doubling means, respectively, where m is 1, 2, 3, . . . , ; and a plurality of flip-flops being triggered in response to an output signal from said inverter to latch output signals from said AND gates and output the latched signals to said decoding means, respectively.

8. A frequency multiplier circuit as set forth in claim 1, wherein said decoding means includes:

a plurality of AND gates for ANDing the output signals from said first delay means and the output signals from said signal detection means, respectively; and an OR gate for ORing output signals from said AND gates and outputting the resultant signal to said frequency generation means.

9. A frequency multiplier circuit as set forth in claim 1, wherein said frequency generation means includes an exclusive OR gate for exclusive-ORing the output signal from said decoding means and said reference clock signal to generate the multiple frequency of that of said reference clock signal.

\* \* \* \* \*